US009666705B2

(12) United States Patent
Prechtl et al.

(10) Patent No.: US 9,666,705 B2
(45) Date of Patent: May 30, 2017

(54) CONTACT STRUCTURES FOR COMPOUND SEMICONDUCTOR DEVICES

(75) Inventors: Gerhard Prechtl, St. Jakob i. Rosental (AT); Clemens Ostermaier, Villach (AT); Oliver Häberlen, Villach (AT); Gianmauro Pozzovivo, Villach (AT)

(73) Assignee: Infineon Technologies Austria AG, Villach (AT)

( * ) Notice: Subject to any disclaimer, the term of this patent is extended or adjusted under 35 U.S.C. 154(b) by 314 days.

(21) Appl. No.: 13/470,771

(22) Filed: May 14, 2012

(65) Prior Publication Data
US 2013/0299842 A1     Nov. 14, 2013

(51) Int. Cl.
| H01L 29/778 | (2006.01) |
| H01L 29/66 | (2006.01) |
| H01L 21/285 | (2006.01) |
| H01L 29/45 | (2006.01) |
| H01L 29/47 | (2006.01) |
| H01L 29/20 | (2006.01) |
| H01L 29/417 | (2006.01) |

(52) U.S. Cl.
CPC ...... *H01L 29/778* (2013.01); *H01L 21/28575* (2013.01); *H01L 29/41766* (2013.01); *H01L 29/452* (2013.01); *H01L 29/66431* (2013.01); *H01L 29/66462* (2013.01); *H01L 29/7786* (2013.01); *H01L 29/2003* (2013.01)

(58) Field of Classification Search
CPC .......... H01L 29/66462; H01L 29/2003; H01L 21/28575; H01L 29/41766; H01L 29/778
USPC .................................................. 257/76, 194
See application file for complete search history.

(56) References Cited

U.S. PATENT DOCUMENTS

| 4,894,350 A | * | 1/1990 | Zwicknagl ......... H01L 21/0272 148/DIG. 100 |
| 6,852,615 B2 | * | 2/2005 | Micovic et al. ............. 438/604 |

(Continued)

FOREIGN PATENT DOCUMENTS

CN       1557024 A     12/2004

OTHER PUBLICATIONS

Inada et al, "Low Specific On-Resistance AlGaN/GaN HEMT on Sapphire Substrate" Proceedings of the 18th International Symposium on Power Semiconductor Devices and IC's, Jun. 4-8, 2006, Naples, Italy, pp. 1-4.*

(Continued)

*Primary Examiner* — Jarrett Stark
*Assistant Examiner* — Charles N Ausar-El
(74) *Attorney, Agent, or Firm* — Murphy, Bilak & Homiller, PLLC

(57) ABSTRACT

A semiconductor device includes a semiconductor body including a plurality of compound semiconductor layers and a two-dimensional charge carrier gas channel region formed in one of the compound semiconductor layers. The semiconductor device further includes a contact structure disposed in the semiconductor body. The contact structure includes a metal region and a doped region. The metal region extends into the semiconductor body from a first side of the semiconductor body to at least the compound semiconductor layer which includes the channel region. The doped region is formed in the semiconductor body between the metal region and the channel region so that the channel region is electrically connected to the metal region through the doped region.

18 Claims, 22 Drawing Sheets

(56) References Cited

U.S. PATENT DOCUMENTS

| | | | |
|---|---|---|---|
| 7,795,642 B2* | 9/2010 | Suh et al. | 257/194 |
| 7,838,905 B2* | 11/2010 | Brar et al. | 257/194 |
| 7,915,617 B2* | 3/2011 | Ogura et al. | 257/77 |
| 7,939,853 B2* | 5/2011 | Murphy et al. | 257/192 |
| 7,999,287 B2* | 8/2011 | Zundel et al. | 257/194 |
| 8,178,898 B2* | 5/2012 | Ikeda | H01L 29/10 257/183 |
| 8,304,814 B2* | 11/2012 | Bauer | 257/205 |
| 8,344,420 B1* | 1/2013 | Jimenez | 257/192 |
| 8,563,372 B2* | 10/2013 | Hagleitner et al. | 438/172 |
| 8,592,871 B2* | 11/2013 | Kajitani | H01L 29/045 257/198 |
| 8,901,604 B2* | 12/2014 | Mishra | H01L 29/7811 257/170 |
| 2001/0049574 A1* | 12/2001 | Taniguchi et al. | 701/51 |
| 2003/0094653 A1* | 5/2003 | Christensen | H01L 29/66772 257/347 |
| 2004/0018705 A1* | 1/2004 | Colson et al. | 438/570 |
| 2005/0184309 A1* | 8/2005 | Nguyen et al. | 257/192 |
| 2005/0258451 A1* | 11/2005 | Saxler et al. | 257/192 |
| 2007/0205430 A1* | 9/2007 | Collins | H01L 29/7371 257/117 |
| 2007/0284653 A1* | 12/2007 | Ueno et al. | 257/324 |
| 2008/0157060 A1 | 7/2008 | Brar et al. | |
| 2009/0072240 A1* | 3/2009 | Suh | H01L 29/2003 257/76 |
| 2010/0032683 A1* | 2/2010 | Ikeda et al. | 257/76 |
| 2010/0184262 A1* | 7/2010 | Smorchkova et al. | 438/172 |
| 2010/0207166 A1* | 8/2010 | Zhu | 257/201 |
| 2010/0264462 A1* | 10/2010 | Hirler | H01L 29/0619 257/194 |
| 2011/0189826 A1* | 8/2011 | Mita et al. | 438/172 |
| 2011/0210337 A1* | 9/2011 | Briere | 257/76 |
| 2011/0284865 A1* | 11/2011 | Inoue et al. | 257/76 |
| 2012/0139630 A1* | 6/2012 | Ozaki | H01L 21/02057 330/250 |
| 2013/0193486 A1* | 8/2013 | Kinoshita | H01L 29/41725 257/194 |
| 2013/0221375 A1* | 8/2013 | Shiomi | H01L 29/66068 257/77 |
| 2014/0014966 A1* | 1/2014 | Tabatabaie | H01L 29/66462 257/76 |

OTHER PUBLICATIONS

Cai et al, "High Performance AlGaN/GaN HEMT with improved Ohmic contacts" Electronic Letters Nov. 26, 1998 vol. 34 No. 24, pp. 2354-2356.*

G.K. Reeves and H.B. Harrison. "Obtaining the Specific Contact Resistance from Transmission Line Model Measurements." IEEE Electron Device Letters, May 1982. vol. EDL-3, No. 5. pp. 111-113.

Tomohisa Shiino, et al. "Ohmic contacts on n-type layers formed in GaN/AlGaN/GaN by dual-energy Si ion implantation." Nuclear Instruments and Methods in Physics Research B, 2009. pp. 1571-1574. Elsevier B.V. Japan.

Hyung-Seok Lee, et al. "AlGaN/GaN High-Electron-Mobility Transistors Fabricated Through a Au-Free Technology." IEEE Electron Device Letters, May 2011. vol. 32, No. 5. pp. 623-626.

A Malmros, et al. "Electrical properties, microstructure, and thermal stability of Ta-based ohmic contacts annealed at low temperature for GaN HEMTs." Semiconductor Science and Technology, Mar. 31, 2011. pp. 1-7. IOP Publishing.

* cited by examiner

CONTACT STRUCTURES FOR COMPOUND SEMICONDUCTOR DEVICES

TECHNICAL FIELD

The instant application generally relates to compound semiconductor devices, and particularly to contact structures for compound semiconductor devices.

BACKGROUND

Low ohmic contacts for power HEMTs (high electron mobility transistors) and other types of heterostructure devices are needed to meet a low RON*A (specific on-resistance, where A corresponds to area) metric. This is especially true for low voltage power devices (30V voltage class and below), where the contact resistance can represent 40% or more of the total device RON*A. Preferably, a low ohmic contact in an AlGaN/GaN HEMT or other heterostructure device has low contact resistance (and therefore low impact on RON) and also low transfer length. If the transfer length is low, the length of the contact can be reduced significantly and the size of the power transistor structure can be correspondingly reduced. However, it is very difficult to provide good ohmic contacts at a heterojunction such as a GaN/AlGaN interface. For example, an optimized 30V GaN power transistor typically has a specific contact resistance of $1.2e-7$ Ohm*mm$^2$ which corresponds to about 40% of the total transistor RON*A. Additionally, special care must be taken to optimize the transfer resistance between the 2DEG (two-dimensional electron gas) channel and the contact. This transfer resistance has a major impact on the overall contact resistance.

One type of conventional GaN/AlGaN HEMT contact is formed by implanting Si into the GaN/AlGaN structure to form a degenerated region in contact with the 2DEG channel (Si acts as an n-type dopant in GaN). A metal contact is formed on the top side of the semiconductor body in contact with the Si doped region. Enough electrical carriers are provided below the metal contact to obtain a good ohmic contact. However, this contact structure has a high transition resistance at the underlying GaN/AlGaN interface which significantly increases the overall specific resistance of the contact area. The high transition resistance arises due to a well pronounced barrier between the GaN/AlGaN interface caused by band discontinuity and induced/spontaneous polarization charges.

Another type of conventional GaN/AlGaN HEMT contact is formed by metal deposition and subsequent annealing performed at typically high temperatures above 600° C. Such high temperature processing prohibits the use of standard aluminum metallization schemes which have melting points below 600° C. With GaN based materials, such high temperature annealing creates nitrogen vacancies under the buried metal contact. These nitrogen vacancies act like n-type dopants in GaN, creating a similar effect as with a conventional Si implanted contact. A recess etch can be performed down to or even below the 2DEG channel to avoid the transition resistance at the GaN/AlGaN interface. However, the buried metal contact structure is in direct contact with the 2DEG channel. Such a direct connection between a metal contact and a 2DEG channel causes current crowding at the channel-metal interface and increases the specific contact resistance.

SUMMARY

Described herein are embodiments of a contact structure for compound semiconductor devices which includes a recessed metal region in combination with a doped region. The contact structure has a reduced transition resistance between the channel and the doped region and avoids the transition resistance at the heterojunction i.e. the interface between two layers or regions of dissimilar crystalline semiconductors such as an AlGaN/GaN interface. The transition resistance between the 2DEG channel and the contact structure is reduced by placing the doped region between the recessed metal region and the channel. This low ohmic contact structure can be realized at very low temperatures e.g. <450° C. With such a low temperature budget, standard aluminum metallization schemes can be used if desired. Other metals and processing temperatures can be used as explained herein.

According to an embodiment of a semiconductor device, the semiconductor device comprises a semiconductor body including a plurality of compound semiconductor layers and a two-dimensional charge carrier gas channel region formed in one of the compound semiconductor layers. The semiconductor device further comprises a contact structure disposed in the semiconductor body. The contact structure comprises a metal region and a doped region. The metal region extends into the semiconductor body from a first side of the semiconductor body to at least the compound semiconductor layer which includes the channel region. The doped region is formed in the semiconductor body between the metal region and the channel region so that the channel region is electrically connected to the metal region through the doped region.

According to another embodiment of a semiconductor device, the semiconductor device comprises a semiconductor body including a plurality of compound semiconductor layers and a channel region formed in one of the compound semiconductor layers. The semiconductor device further includes a metal region extending into the semiconductor body from a first side of the semiconductor body to at least the compound semiconductor layer which includes the channel region, and a doped region formed in the semiconductor body and interposed between the metal region and the channel region so that the channel region is spaced apart from the metal region by the doped region.

According to an embodiment of a transistor, the transistor comprises a semiconductor body including a plurality of compound semiconductor layers with a heterojunction between two dissimilar ones of the compound semiconductor layers. A channel region is formed below the heterojunction. A metal region extends into the semiconductor body below the heterojunction to at least the channel region. A doped region formed in the semiconductor body is interposed between the metal region and the channel region so that the channel region is spaced apart from the metal region by the doped region.

According to an embodiment of a method of manufacturing a semiconductor device, the method comprises: providing a semiconductor body comprising a plurality of compound semiconductor layers and a two-dimensional charge carrier gas channel region formed in one of the compound semiconductor layers; and forming a contact structure in the semiconductor body. The contact structure comprises a metal region extending into the semiconductor body from a first side of the semiconductor body to at least the compound semiconductor layer which includes the channel region. The contact structure further comprises a doped region formed in the semiconductor body between the metal region and the channel region so that the channel region is electrically connected to the metal region through the doped region.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
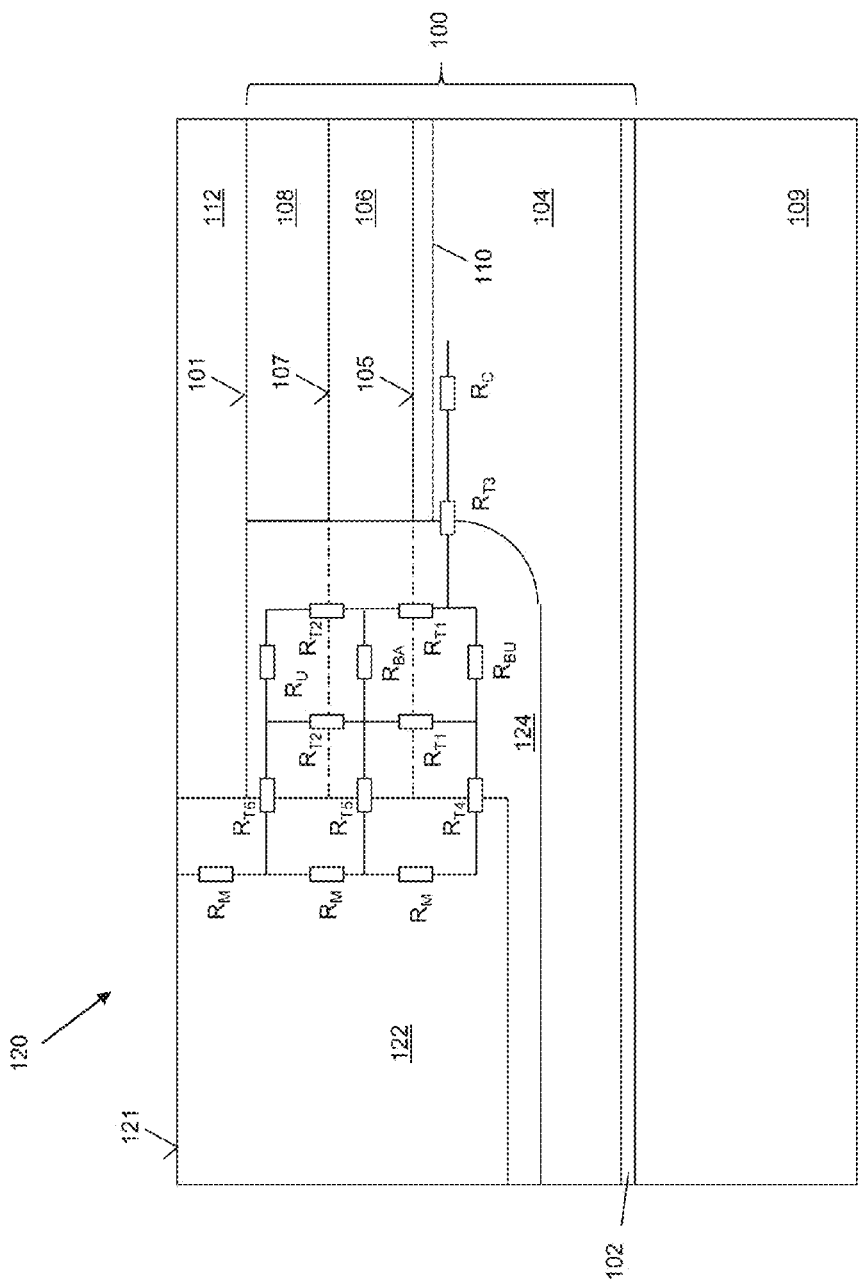
FIG. 1 illustrates a partial cross-sectional view of a compound semiconductor device with a contact structure having a metal region and a doped region formed in a body of the device.

FIG. 1 illustrates a partial cross-sectional view of a semiconductor device that includes a semiconductor body 100 having a plurality of compound semiconductor layers disposed on a substrate 109. The substrate 109 can be a semiconductor substrate such as a Si, sapphire, SiC, GaN or diamond substrate. The substrate 109 can be doped or undoped. In one embodiment, the semiconductor body 100 disposed on the substrate 109 includes a nucleation (seed) layer 102 such as an AlN layer on the substrate 109, a first compound semiconductor device layer 104 (also referred to herein as a buffer region) on the nucleation layer 102, a second compound semiconductor device layer 106 (also referred to herein as a barrier region) on the buffer region 104, and a third compound semiconductor device layer 108 which may be of the same material as the buffer region 104, on the barrier region 106. In one embodiment, the buffer region 104 comprises GaN, the barrier region 106 comprises a GaN alloy such as AlGaN, InAlN, AN or InAlGaN, the third compound semiconductor device layer 108 comprises a GaN cap layer, and a 2DEG (two-dimensional electron gas) channel region 110 arises in the buffer region 104 near the interface between the buffer and barrier regions 104, 106. In this embodiment, a first heterojunction 105 exists between the GaN alloy layer 106 and the lower GaN layer 104 and a second heterojunction 107 exists between the GaN alloy layer 106 and the GaN cap layer 108. The channel region 110 is formed in the lower GaN layer 104 below both heterojunctions 105, 107.

In general with GaN technology, GaN-based heterostructures can be grown along the c-direction (i.e., the Ga-face) or along the N-face e.g. for GaN/AlGaN heterostructures. Either growth orientation can be used in fabricating the GaN-based structures described herein. Also with GaN technology, the presence of polarization charges and strain effects result in the realization of a two-dimensional charge carrier gas which is a two-dimensional electron or hole inversion layer characterized by very high carrier density and carrier mobility. Such a two-dimensional charge carrier gas forms the conductive channel region 110 of the device. A thin e.g. 1-2 nm AlN layer can be provided between the GaN buffer region 104 and the GaN alloy barrier region 106 to minimize alloy scattering and enhance 2DEG mobility. Other compound semiconductor technologies which have a two-dimensional electron or hole gas can also be used. In each case, polarization charges are used to form the two-dimensional charge carrier gas channel region 110 of the device. Other combinations of III-V semiconductor materials can be used in order to form a 2DEG or 2DHG (two-dimensional hole gas) in the buffer region 104 of the device as is well known in the art. In general, any heterostructure can be used where a band discontinuity is responsible for the device concept. A passivation layer 112 can be formed on the semiconductor body 100.

In each case, a contact structure 120 is disposed in the semiconductor body 100 for electrically contacting the channel region 110. The contact structure 120 includes a metal region 122 and a doped (degenerated) region 124. The metal region 122 extends into the semiconductor body 100 from a first side 101 of the semiconductor body 100 to at least the compound semiconductor layer which includes the channel region 110. In the embodiment shown in FIG. 1, this layer is the buffer region 104. The metal region 122 can comprise a Ti/Al-based/metal1/metal2 combination where the Al-based metal can be pure Al, AlSi, AlCu, or AlSiCu, metal1 can be Ni, Ti, Mo, Pt, Pd, Nb, Re, Ta, Ir, TiAl3, or W, and metal2 can be Au, TiN, TiAl3, or W. Alternatively, the metal region 122 can comprise a Ti/Al-based/metal1 combination where the Al-based metal can be pure Al, AlSi, AlCu, or AlSiCu and metal1 can be Ni, Ti, Mo, Pt, Pd, Nb, Re, Ta, Ir, TiAl3, or W. In another embodiment, the metal region 122 can comprise a Ti/Al-based combination where the Al-based metal can be pure Al, AlSi, AlCu, or AlSiCu. In yet another embodiment, the metal region 122 can comprise a direct metal contact (i.e. without a Ti liner) where the metal can be an Al-based metal such as pure Al, AlSi, AlCu, or AlSiCu. Ni, Ti, Mo, Pt, Pd, Nb, Re, Ta, Ir, TiAl3, W and all other metals having a degenerated conduction band can be used.

In each case, the doped region 124 is formed in the semiconductor body 100 between the metal region 122 and the channel region 110 so that the channel region 110 is spaced apart from and electrically connected to the metal region 124 through the doped region 122. In one embodiment, the doped region 124 is formed by implanting Si atoms into the semiconductor body 100 and annealing the semiconductor body 100 to active the Si dopants as described in more detail later herein. The contact structure 120 has reduced transition resistance between the channel region 110 and the contact structure 120 and avoids the transition resistance at the heterojunctions 105, 107 between dissimilar semiconductor materials.

An equivalent electrical circuit of the contact structure 120 is overlaid on the contact structure 120 in FIG. 1 to better illustrate the different contact resistance contributions. In the equivalent circuit diagram, the transition resistance between the buffer region 104 and the barrier region 106 is shown as resistance $R_{T1}$ and the transition resistance between the barrier region 106 and the upper compound semiconductor layer 108 is shown as resistance $R_{T2}$. The transition resistances $R_{T1}$ and $R_{T2}$ at the heterojunctions 105, 107 are avoided by the inclusion of the metal contact region 122. That is, current travels laterally through the buffer region 104 in the doped region 124 of the contact structure 120 to the metal region 122, and then travels vertically up or down, depending on the placement of the connection to the metal contact region 122. As shown in FIG. 1, connection to the metal region 122 of the contact structure 120 can be made at the side 121 of the metal region 122 facing away from the substrate 109. In other embodiments, connection can be made to the metal contact region 122 at the side of the metal contact region 122 facing the substrate 109 as described in more detail later herein.

In each case, the transition resistance between the channel region 110 and the contact structure 120 is minimized by the inclusion of the doped (degenerated) semiconductor region 124 disposed in the semiconductor body 100 between the channel region 110 and the metal contact region 122. The reduced transition resistance between the channel region 110 and the doped region 124 is shown as resistance $R_{T3}$ and the reduced transition resistance between the metal contact region 122 and the different compound semiconductor materials of the doped region 124 (which are demarcated by dashed lines within region 124 in FIG. 1) is shown as resistances $R_{T4}$, $R_{T5}$ and $R_{T6}$. The doped semiconductor region 124 of the contact structure 120 provides an optimized current distribution over a broader area, reducing current crowding and overall contact resistance. Current crowding is reduced because the current can spread over more of the interface between the channel region 110 and the doped region 124. The resistance of the metal contact region 122 is shown as resistance $R_M$, the sheet resistance of the buffer region 104 is shown as resistance $R_{BU}$, the sheet resistance of the barrier region 106 is shown as resistance $R_{BA}$, the sheet resistance of the upper compound semiconductor layer 108 is shown as resistance $R_U$, and the specific resistance of the channel region 110 is shown as resistance $R_C$.

Figure 2:
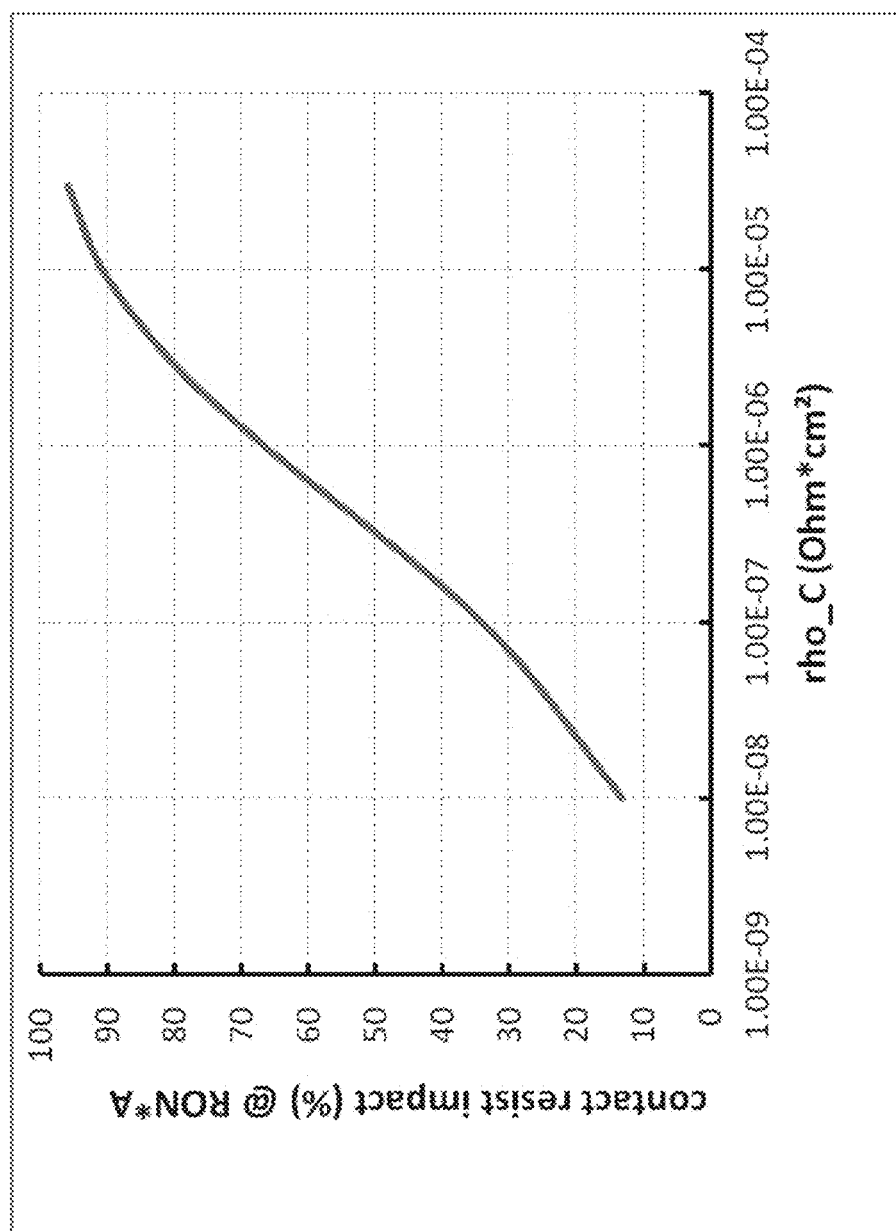
FIG. 2 is a plot diagram showing the contribution of the specific resistance of the contact structure to the overall specific resistance of the device.

Simulation results show the specific resistance of the contact structure 120 can be reduced by nearly a factor of 2× for a GaN buffer region 104 and AlGaN barrier region 106, as compared to a conventional dual contact implantation with no metal contact recess, by forming the metal region 122 of the contact structure 120 so that the metal region 122 extends to at least the compound semiconductor layer which includes the channel region 110. Such a specific contact resistance reduction yields at least a 40% improvement of the RON*A figure of merit for the semiconductor device in this case, including the optimum contact length which depends on the transfer length (the transfer length depends on the specific contact resistance). Moreover, such a specific contact resistance reduction lowers the contribution of the contact resistance to the overall RON*A to about 25% or less from about 40% for comparable conventional devices as shown in FIG. 2 where rho_C is the specific resistance of the contact structure 120 in Ohm*cm$^2$. Furthermore, the contact length can be modified accordingly to reduce the device size. In some embodiments, the contact structure 120 has a specific resistance of 1.0E-7 Ohm*cm$^2$ or less, and more particularly 0.5E-7 Ohm*cm2 or less. A transistor having such a specific contact resistance is well suited for lower voltage applications e.g. of 30V or less.

Figure 3:
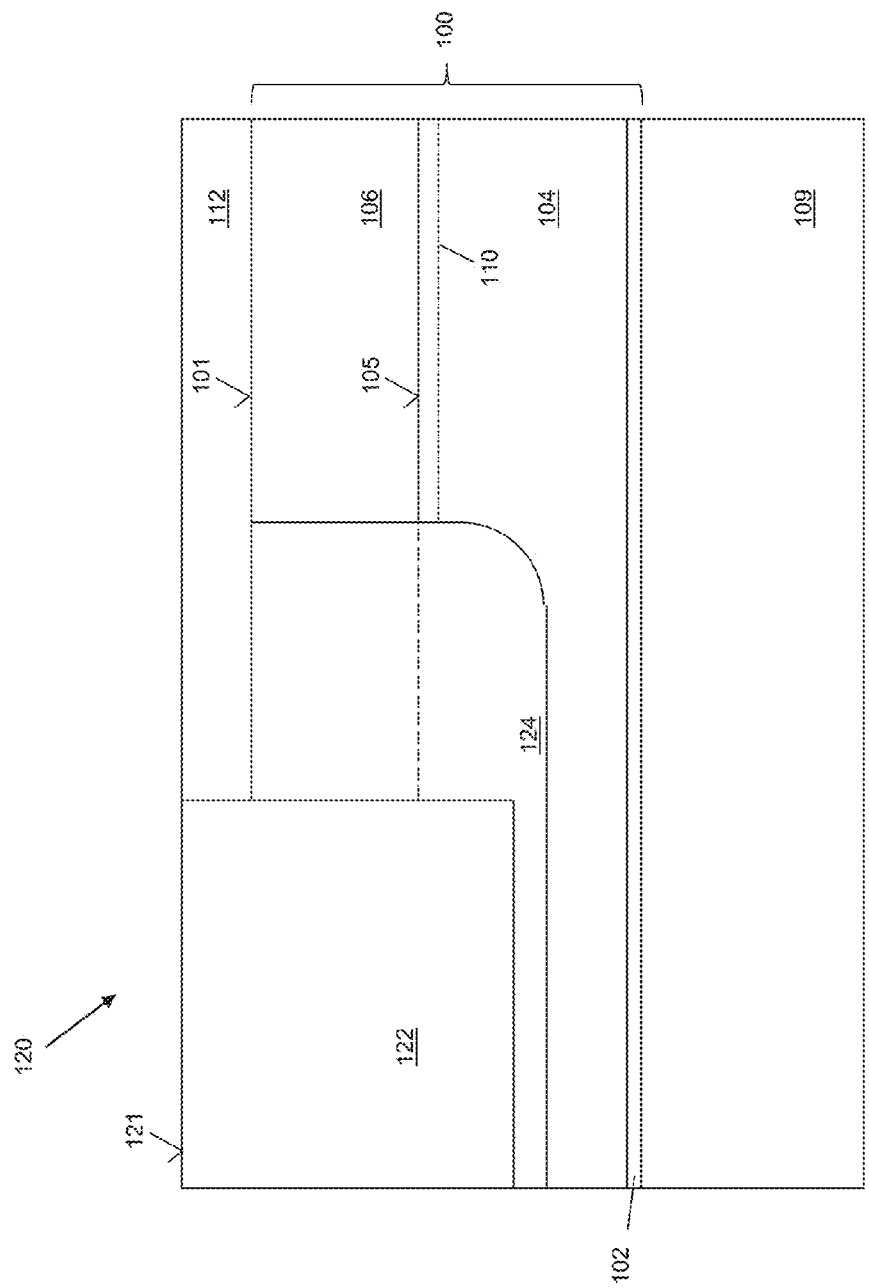
FIG. 3 illustrates a partial cross-sectional view of a compound semiconductor device with a contact structure having a metal region and a doped region formed in a body of the device according to an embodiment.

FIG. 3 illustrates a partial cross-sectional view of another embodiment of a semiconductor device which is similar to the embodiment shown in FIG. 1, however the cap layer 108 is omitted.

Figure 4:
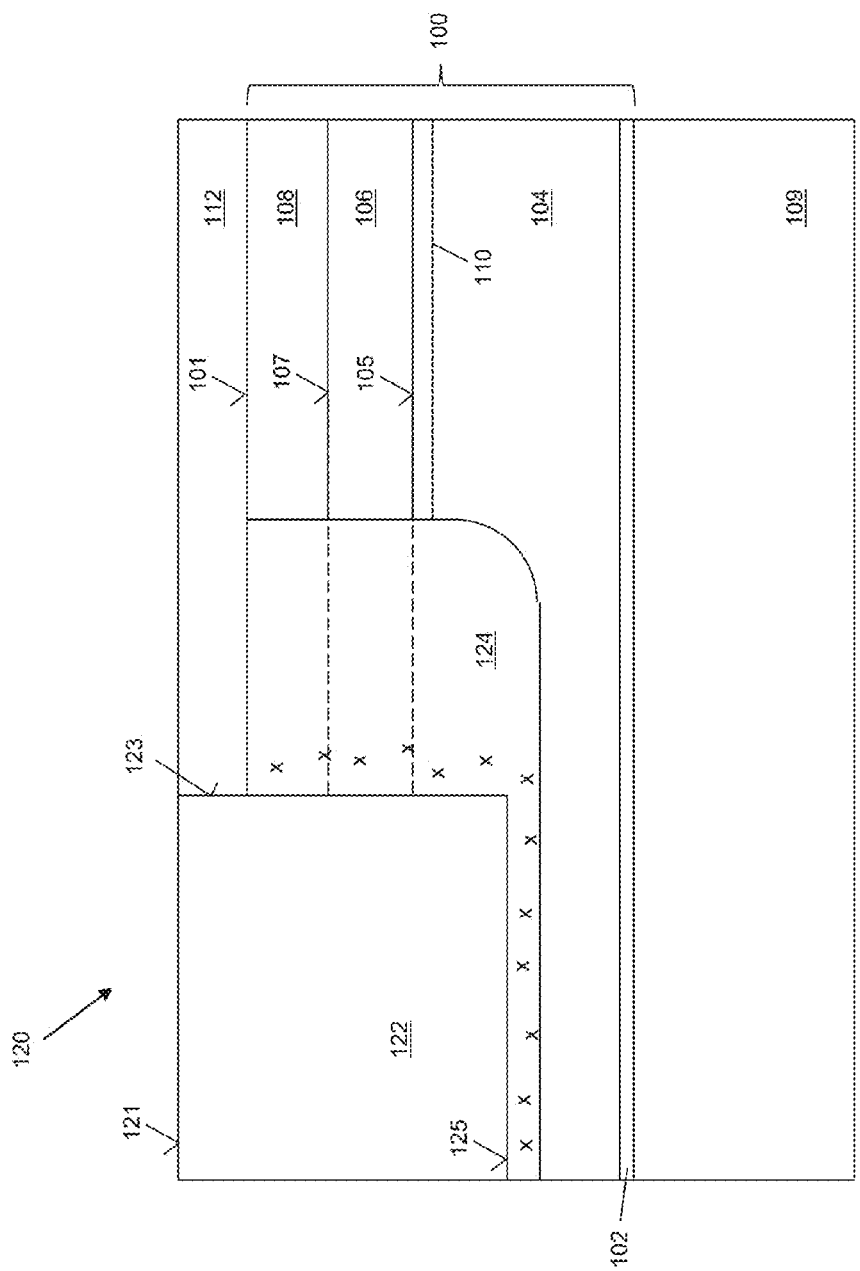
FIG. 4 illustrates a partial cross-sectional view of a compound semiconductor device with a contact structure having a metal region and a doped region formed in a body of the device according to another embodiment.

FIG. 4 illustrates a partial cross-sectional view of another embodiment of a semiconductor device which is similar to the embodiment shown in FIG. 1, however the semiconductor body 100 is annealed at a temperature above 450° C. after the metal region 122 of the contact structure 120 is formed. Annealing at such a high temperature eliminates certain metals from consideration for the metal contact region 122 (such as aluminum), but results in nitrogen vacancies forming in a region of the semiconductor body 100 adjacent the lateral and bottom sides 123, 125 of the metal contact region 122. The nitrogen vacancies further reduce the overall specific resistance of the contact structure 120 by acting like n-type dopants in GaN. The nitrogen vacancies are represented by the symbol 'x' in FIG. 4.

Alternatively, the semiconductor body 100 can be subjected to a temperature <450° C. after the metal contact region 122 is formed so that aluminum or other types of low melting point metals can be used for the metal region 122 of the contact structure 120. An annealing temperature <450° C. does not yield nitrogen vacancies, but still improves the junction quality between the metal contact region 122 and the surrounding semiconductor material which contains e.g. GaN or a GaN alloy.

The embodiments shown in FIGS. 1, 3 and 4 have the doped region 124 of the contact structure 120 extending deeper into the semiconductor body 100 from the first side 101 than the metal region 122 of the contact structure 120. This way, the doped region 124 contacts the lateral and bottom sides 123, 125 of the metal region 122.

Figure 5:
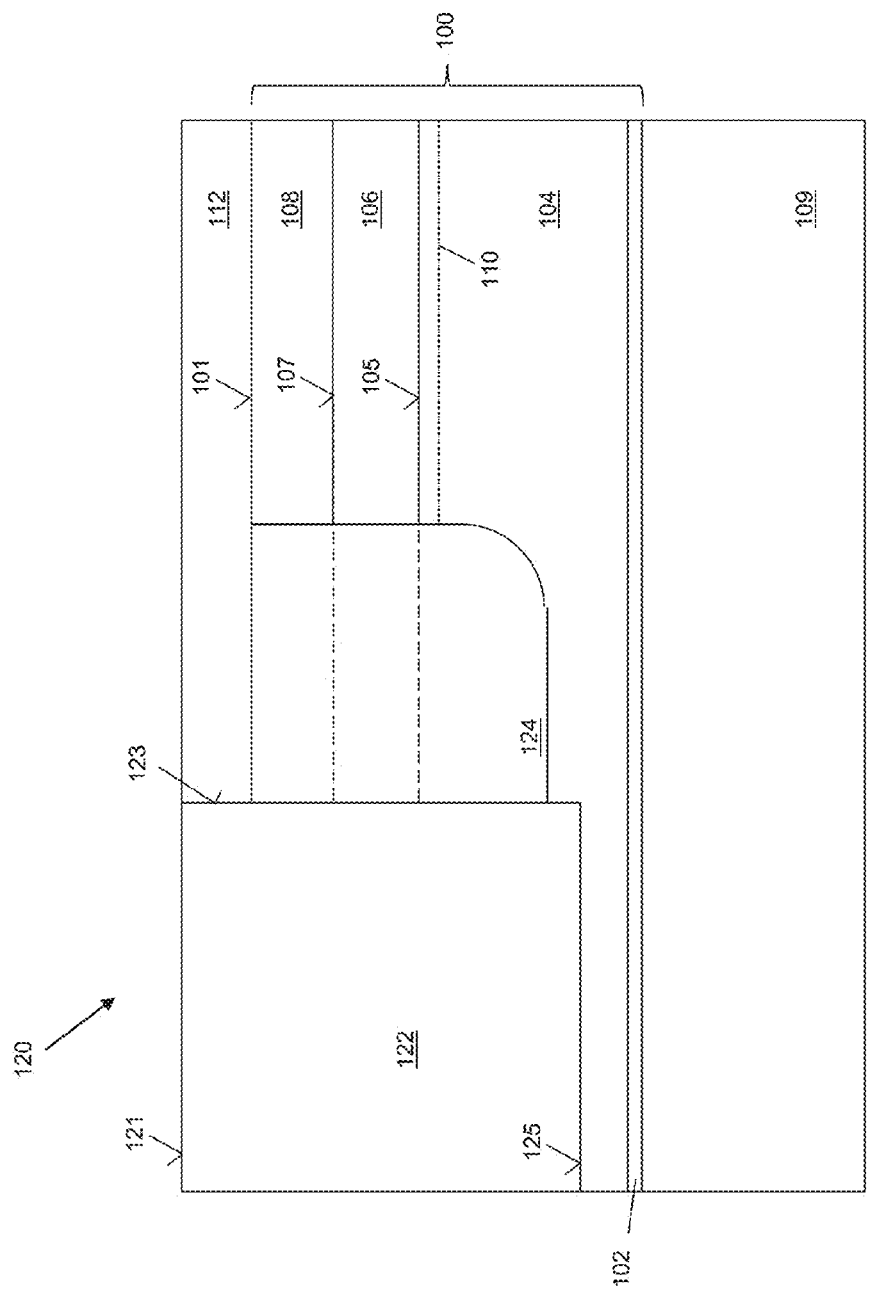
FIG. 5 illustrates a partial cross-sectional view of a compound semiconductor device with a contact structure having a metal region and a doped region formed in a body of the device according to yet another embodiment.

FIG. 5 illustrates yet another embodiment of the semiconductor device which is similar to the embodiment shown in FIG. 1, however the metal region 122 of the contact structure 120 extends deeper into the semiconductor body 100 from the first side 101 than the doped region 124 of the contact structure 120. According to this embodiment, the doped region 124 contacts the lateral sides 123 of the metal region 122 but not the bottom side 125.

Figure 6:
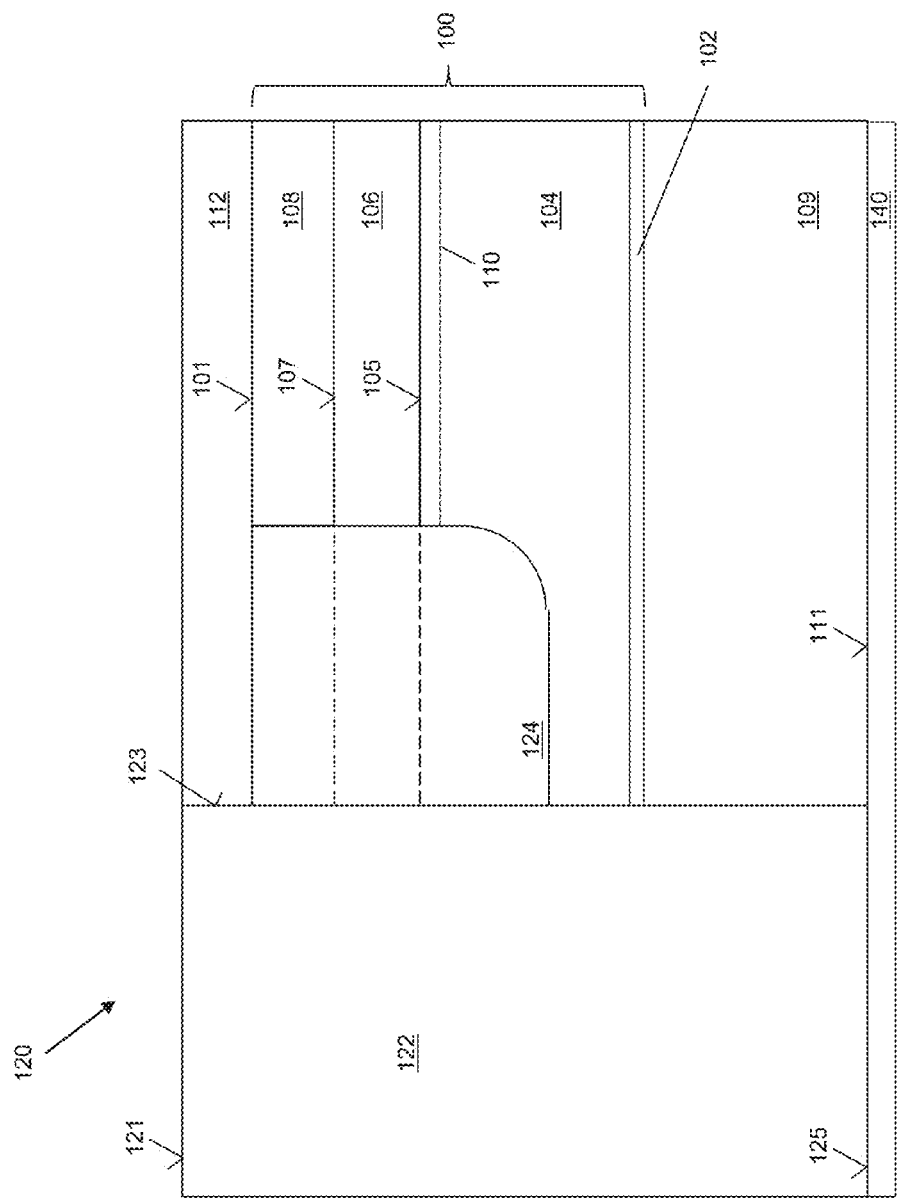
FIG. 6 illustrates a partial cross-sectional view of a compound semiconductor device with a contact structure having a metal region and a doped region formed in a body of the device according to still another embodiment.

FIG. 6 illustrates still another embodiment of the semiconductor device which is similar to the embodiment shown in FIG. 5, however the metal region 122 of the contact structure 120 extends completely through the semiconductor body 100 and completely through the underlying substrate 109. According to this embodiment, the metal region 122 is connected to a metallization 140 formed on the backside 111 of the substrate 109 and therefore electrically connected at the substrate backside 111.

Figure 7:
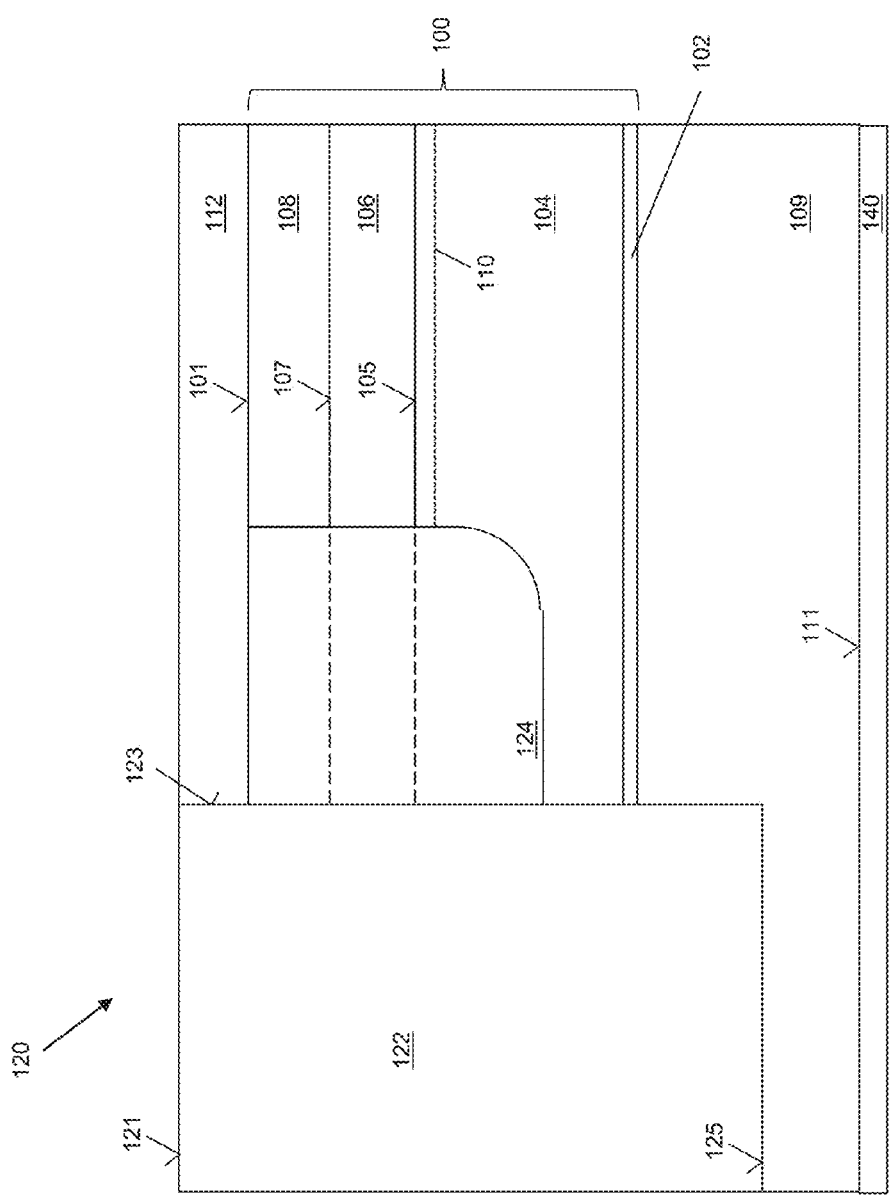
FIG. 7 illustrates a partial cross-sectional view of a compound semiconductor device with a contact structure having a metal region and a doped region formed in a body of the device according to another embodiment.

FIG. 7 illustrates still another embodiment of the semiconductor device which is similar to the embodiment shown in FIG. 5, however the metal region 122 of the contact structure 120 does not extend completely through the underlying substrate 109. Instead, the metal region 122 extends into the substrate 109 and terminates prior to reaching the backside 111 of the substrate 109. According to this embodiment, the substrate 109 is doped so that an electrical connection is made between the metal contact region 122 and the metallized backside 111 of the substrate 109 via the doped substrate 109.

Figure 8:
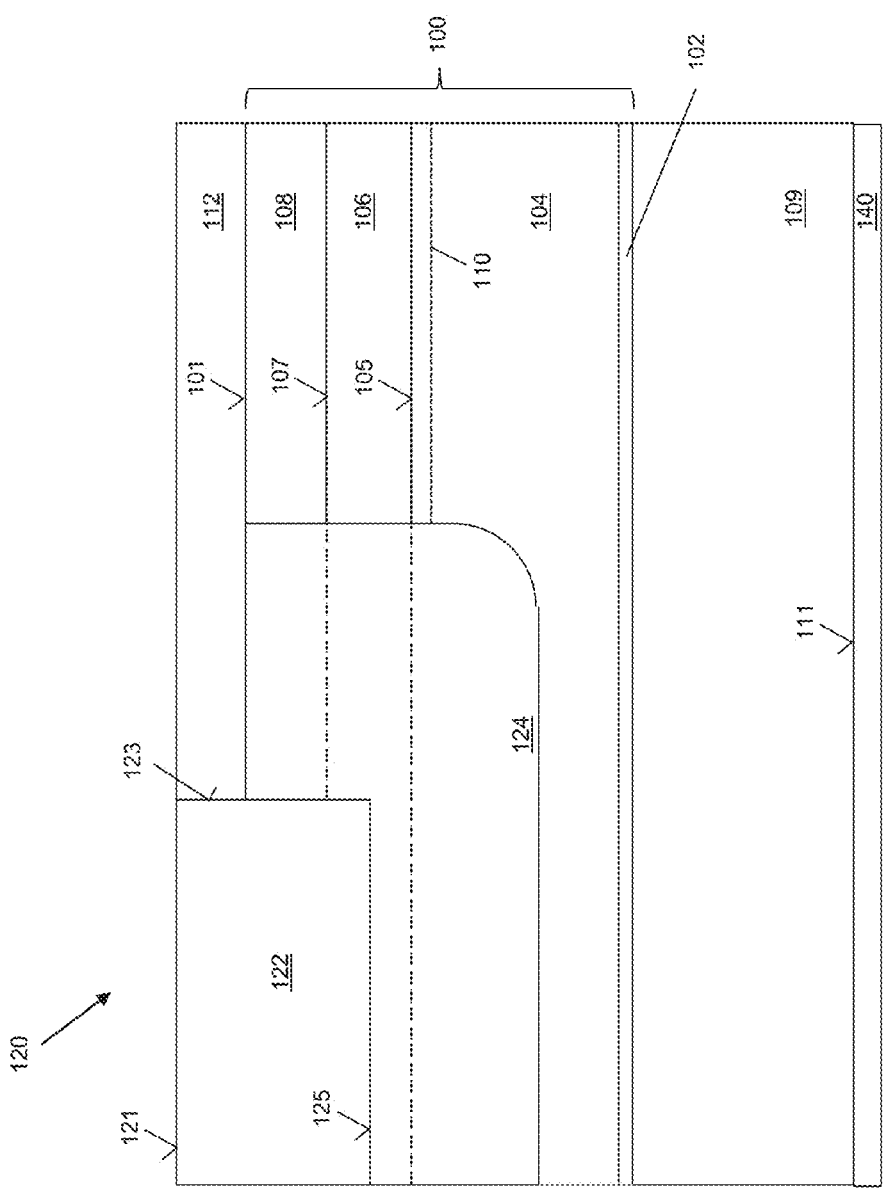
FIG. 8 illustrates a partial cross-sectional view of a compound semiconductor device with a contact structure having a metal region and a doped region formed in a body of the device according to an embodiment.

FIG. 8 illustrates an embodiment of the semiconductor device which is similar to the embodiment shown in FIG. 1, however the metal region 122 of the contact structure 120 extends into the barrier region 106 but not into the underlying buffer region 104. According to this embodiment, the bottom side 125 of the metal contact region 122 extends to a shallower depth measured from the front side 101 of the semiconductor body 100 than the channel region 110.

Figure 9:
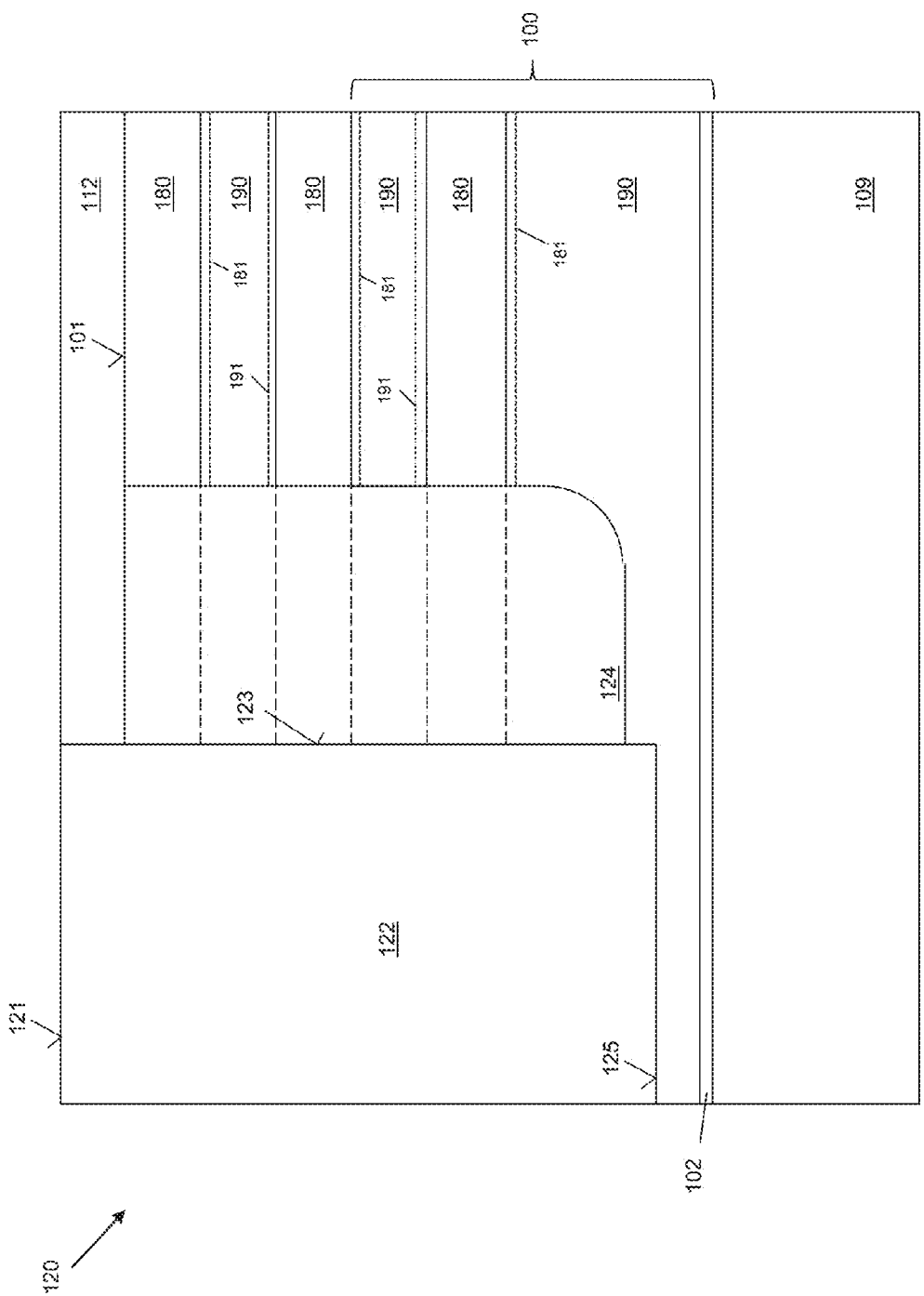
FIG. 9 illustrates a partial cross-sectional view of a compound semiconductor device with a contact structure having a metal region and a doped region formed in a body of the device according to another embodiment.

FIG. 9 illustrates another embodiment of a semiconductor device which includes a plurality of AlGaN or InAlN layers 180 interposed between respective GaN layers 190 in a vertical direction of the device which extends perpendicular to the top side 101 of the semiconductor body 100. The GaN cap layer is omitted in FIG. 8 similarly as shown in FIG. 3, but may be included between the uppermost AlGaN or InAlN layer 180 and the passivation layer 112 as previously described herein. According to this embodiment, a 2DEG 181 arises in the lowermost GaN layer 190 near the interface with the lowermost AlGaN or InAlN layer 180. Each successive GaN layer 180 has a lower 2DHG 191 which arises near the interface with the underlying AlGaN or InAlN layer 180 and an upper 2DEG 181 which arises near the interface with the overlying AlGaN or InAlN layer 180. This way, multiple 2DEGs and 2DHGs are present in the device.

Figure 10:
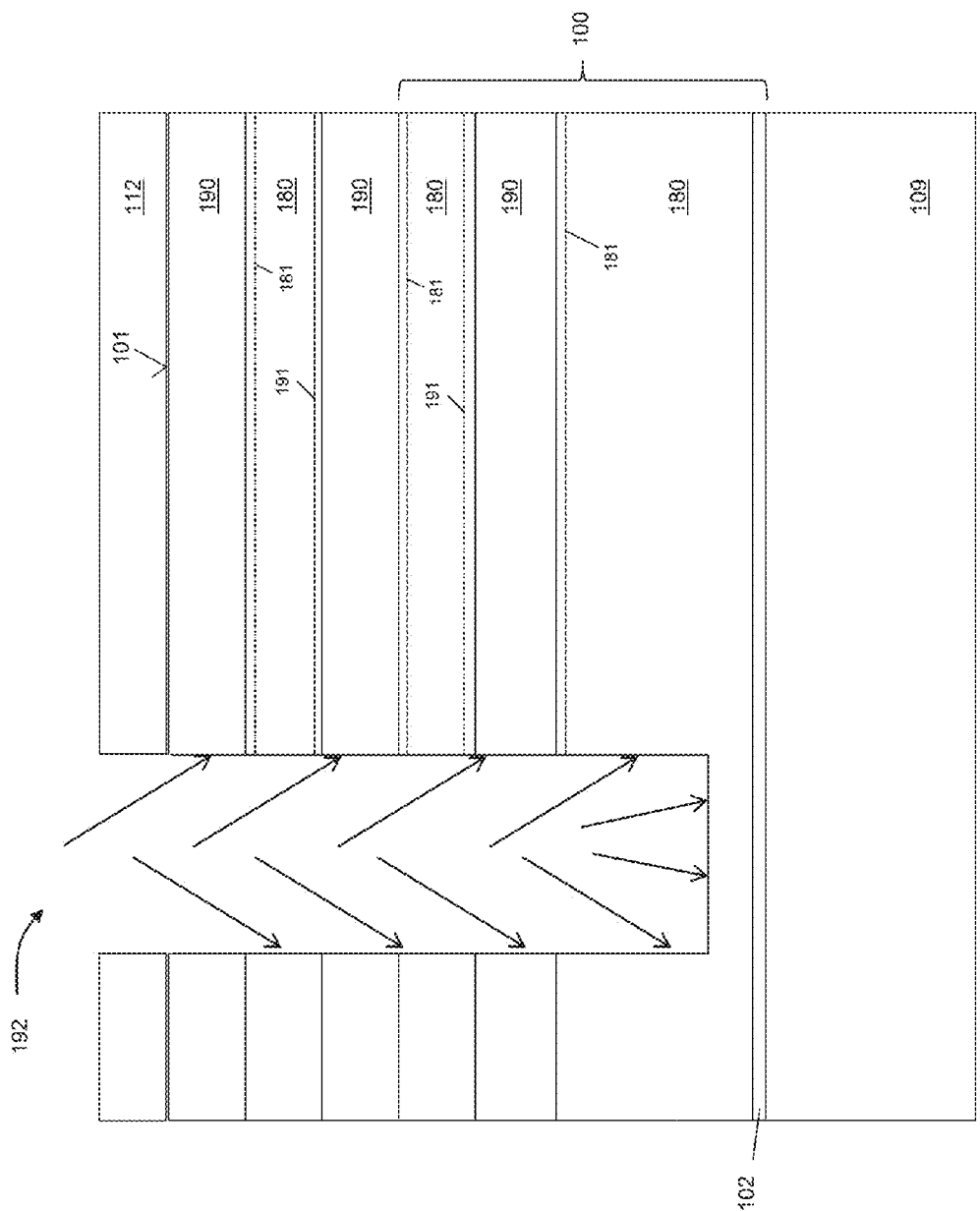
FIG. 10 illustrates an embodiment of process of forming the doped region of the contact structure shown in FIG. 9.
Figure 11A:
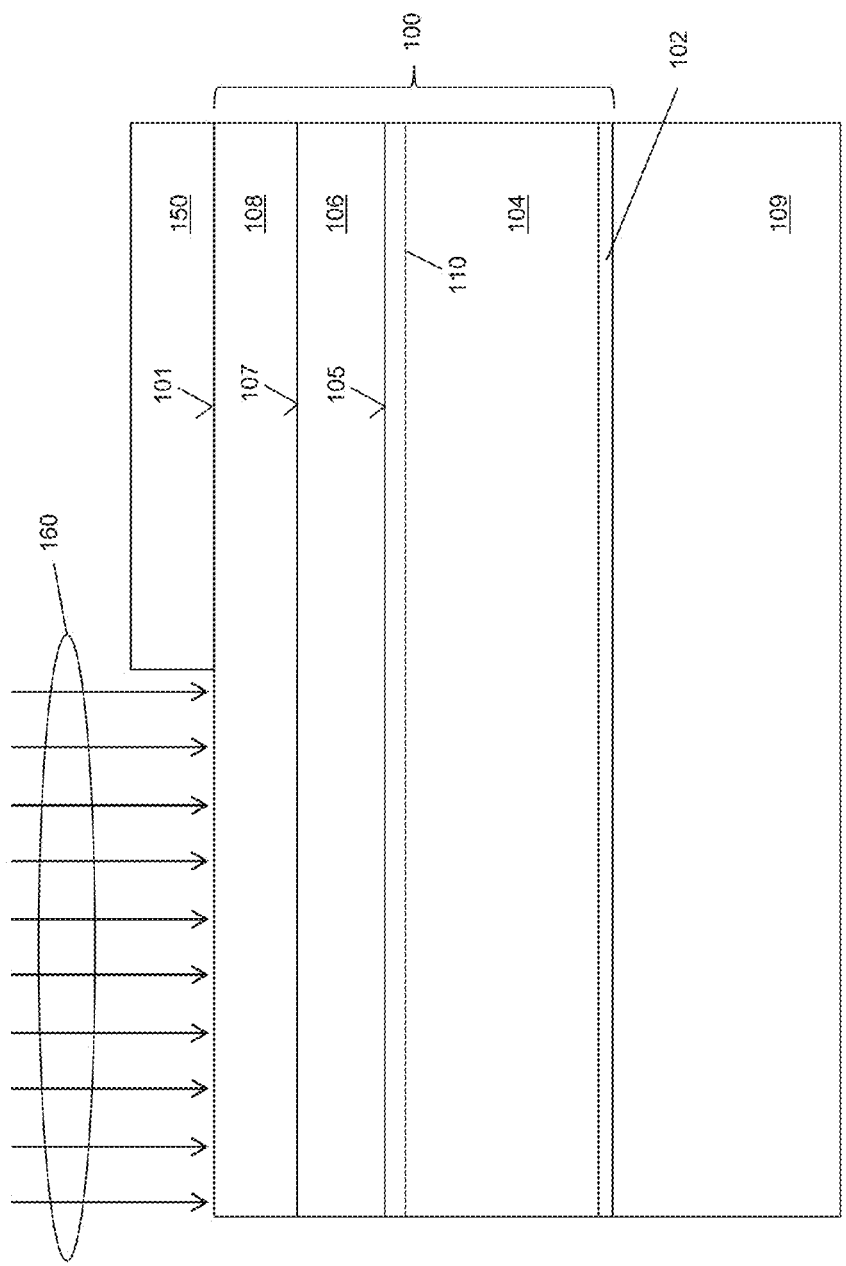
FIGS. 11A to 11C illustrate an embodiment of a method of manufacturing the contact structure.
Figure 11B:
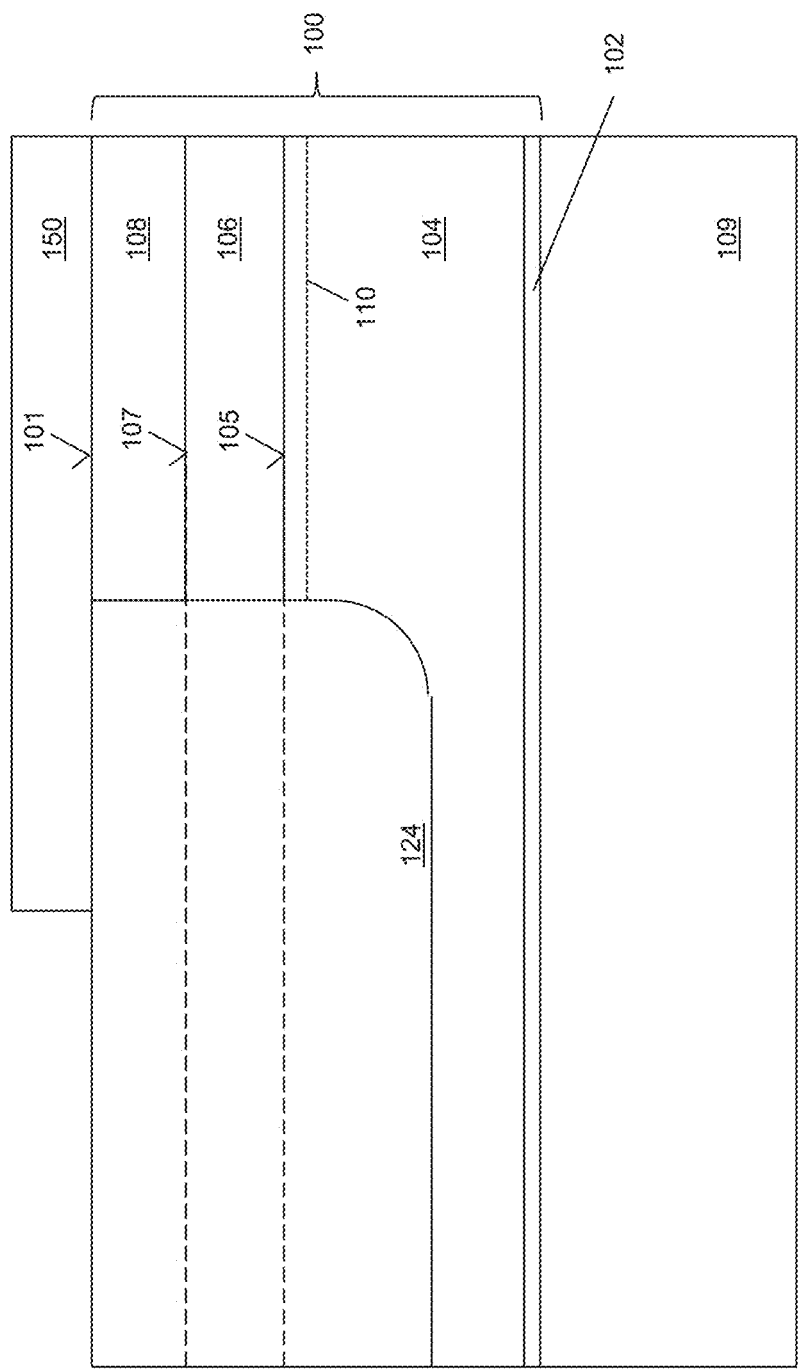
Figure 11C:
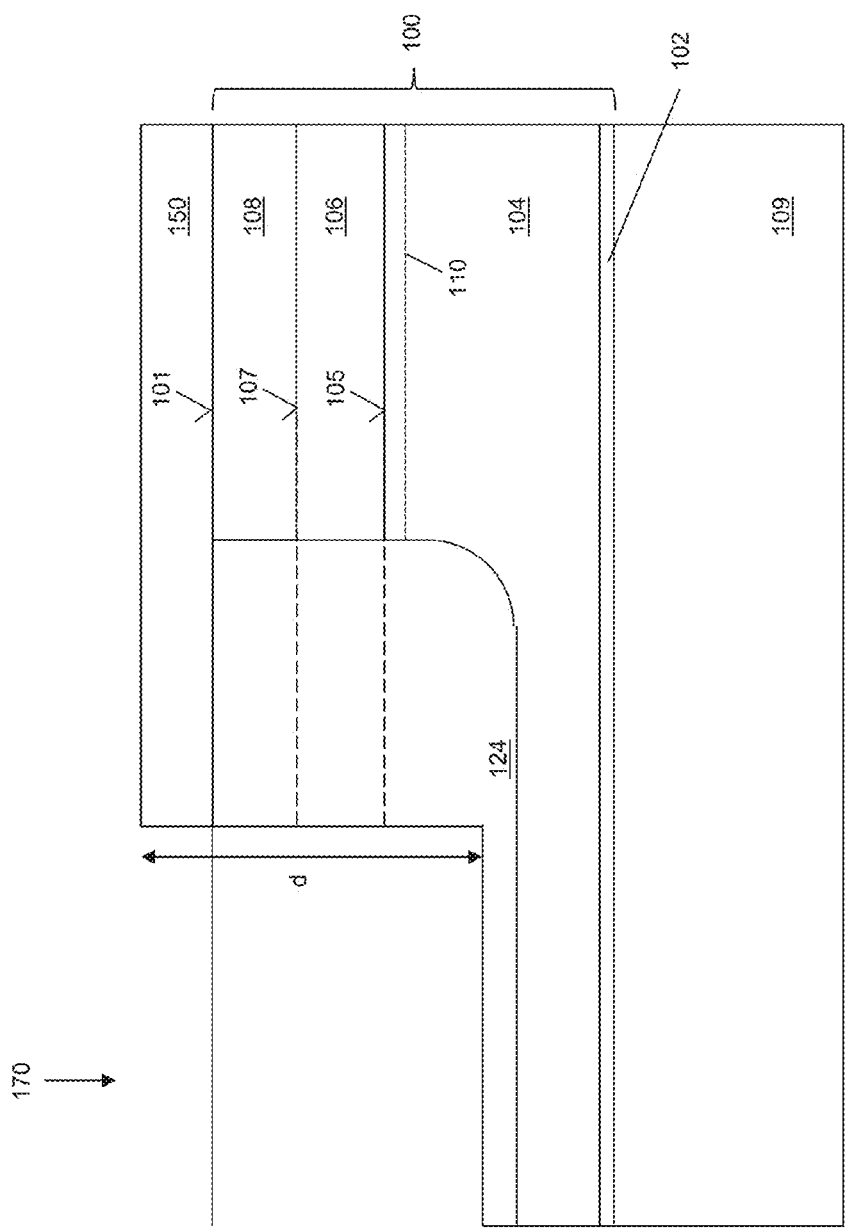

FIG. 10 illustrates an embodiment of forming the doped region 124 of the contact structure 120 for the semiconductor device of FIG. 9. According to this embodiment, and opening 192 is etched into the semiconductor body 100 from the top side 101 and dopant species such as Si for a GaN-based semiconductor body are implanted into the sidewalls and bottom of the opening 192 as indicated by the downward facing arrows in FIG. 10. The implanted dopant species is annealed to form the doped region 124 of the contact structure 120 as shown in FIG. 9. FIGS. 11A to 11C illustrate an embodiment of a method of manufacturing the contact structure 120. In FIG. 11A, a photoresist deposition and development process is carried out to form a mask 150 on the top side 101 of the semiconductor body 100 so that part of the semiconductor body 100 remains uncovered. A dopant species 160 such as Si in the case of GaN-based semiconductor body 100 is implanted into the uncovered part of the semiconductor body 100 as shown in FIG. 11A.

The semiconductor body 100 is annealed at an elevated temperature to activate the implanted dopant species and form the doped region 124 of the contact structure 120 as shown in FIG. 11B. A part of the doped region 124 is then removed to a depth d from the top side 101 of the semiconductor body 100 to at least the channel region 110 to form an opening 170 in the semiconductor body 100 as shown in FIG. 11C. The opening 170 is laterally spaced apart from the channel region 120 by a remaining part of the doped region 124.

The opening 170 can be etched into the semiconductor body 100 so that the opening 170 extends shallower in the semiconductor body 100 from the top side 101 than the doped region 124 e.g. as shown in FIGS. 1, 3, 4 and 8. Alternatively, the opening 170 can be etched completely through the doped region 124 so that the opening 170 extends deeper in the semiconductor body 100 from the top side 101 than the doped region 124 e.g. as shown in FIGS. 5 and 9. The opening 170 can be etched completely through the semiconductor body 100 into or completely through the underlying substrate 109 e.g. as shown in FIGS. 6 and 7. In each case, the opening 170 is filled with metal e.g. of the type previously described herein to complete the contact structure 120.

In one embodiment, the semiconductor body 100 comprises a lower GaN layer 104, an intermediary GaN alloy layer 106 on the lower GaN layer 104 and a GaN cap layer 108 on the GaN alloy layer 106. Si dopant species are implanted into the uncovered part of the semiconductor body 100 and into the GaN cap layer 108, the GaN alloy layer 106 and the lower GaN layer 104 e.g. as shown in FIG. 8A so that the doped region 124 of the contact structure 120 contacts the two-dimensional electron gas channel region 110 after annealing i.e. after activation of the implanted dopants. The semiconductor body 100 can be annealed after the opening 170 is filled with metal at a relatively lower temperature e.g. <450° C. to ensure good contact between the metal contact region 122 and the adjacent semiconductor material or at a relatively higher temperature e.g. >600° C. to form nitrogen vacancies around the lateral and bottom sides 123, 125 of the metal contact region 122, both as previously described herein.

Figure 12A:
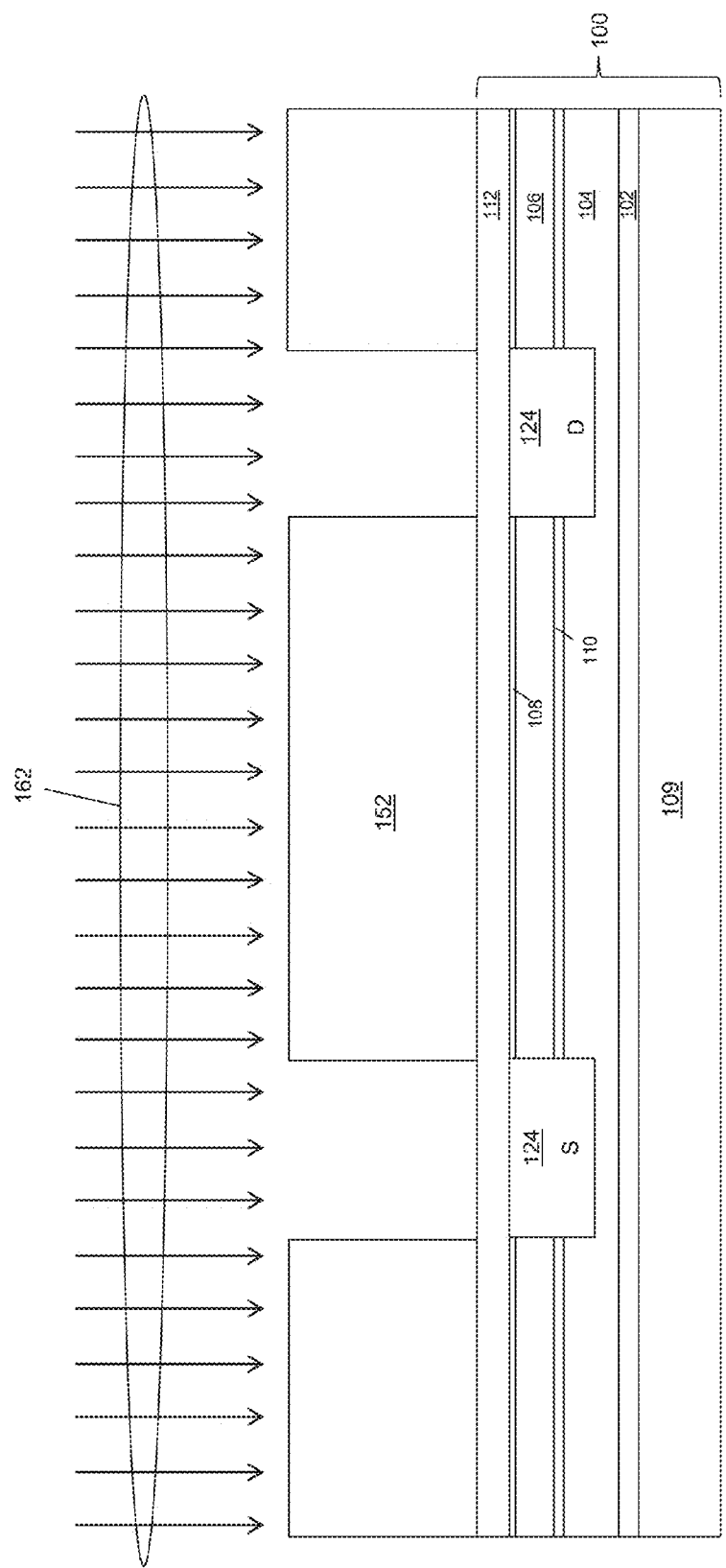
FIGS. 12A to 12G illustrate another embodiment of a method of manufacturing the contact structure.

FIGS. 12A to 12G illustrate another embodiment of a method of manufacturing the contact structure 120 for a transistor device. A photoresist deposition and development process is carried out to form a mask 152 on the top side 101 of the semiconductor body 100 so that parts of the semiconductor body 100 remain uncovered. Si dopant species 162 are implanted into the uncovered parts of the semiconductor body 100 and annealed to form the implanted region 124 of each respective contact structure 120. The implanted Si regions 124 also form the source (S) and drain (D) regions of the device, respectively, as shown in FIG. 12A.

Figure 12B:
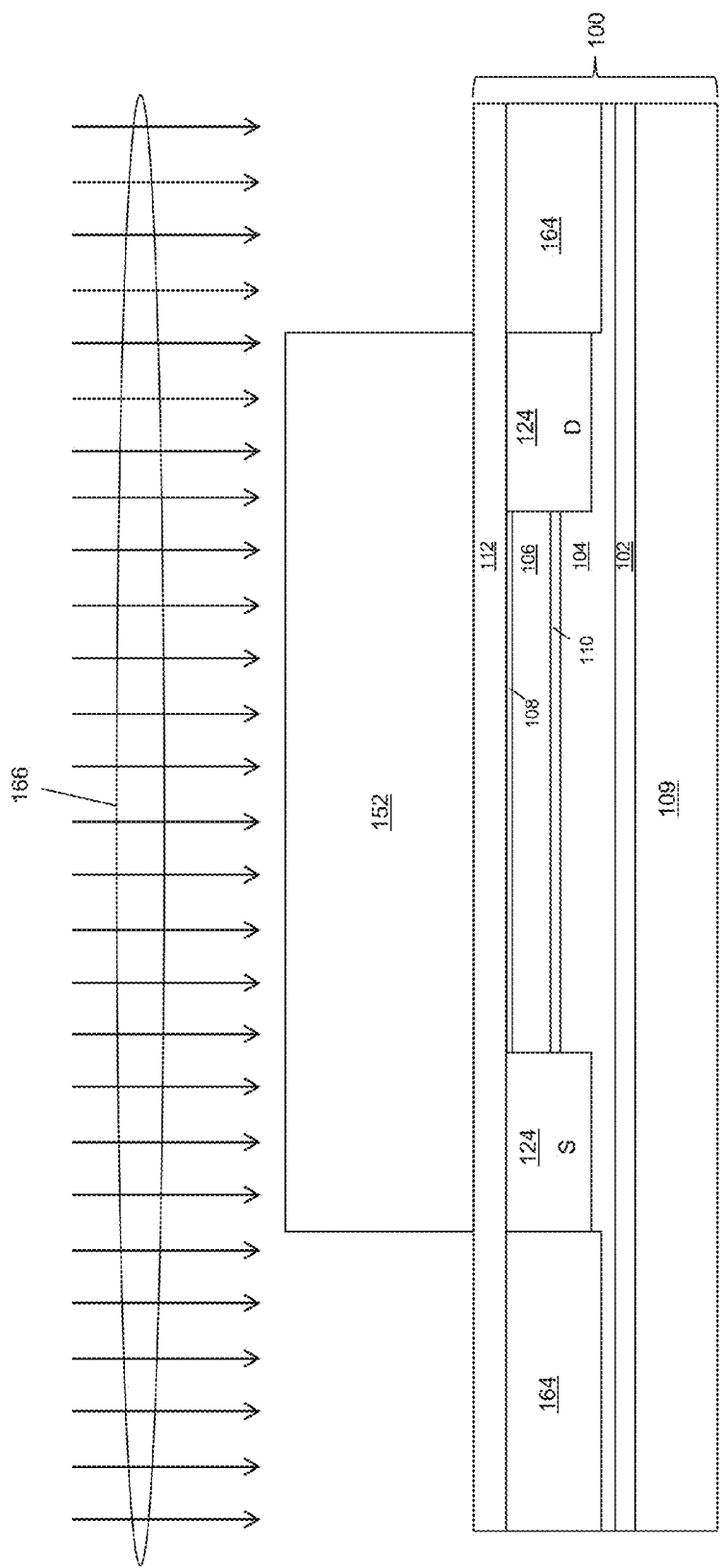
Figure 12C:
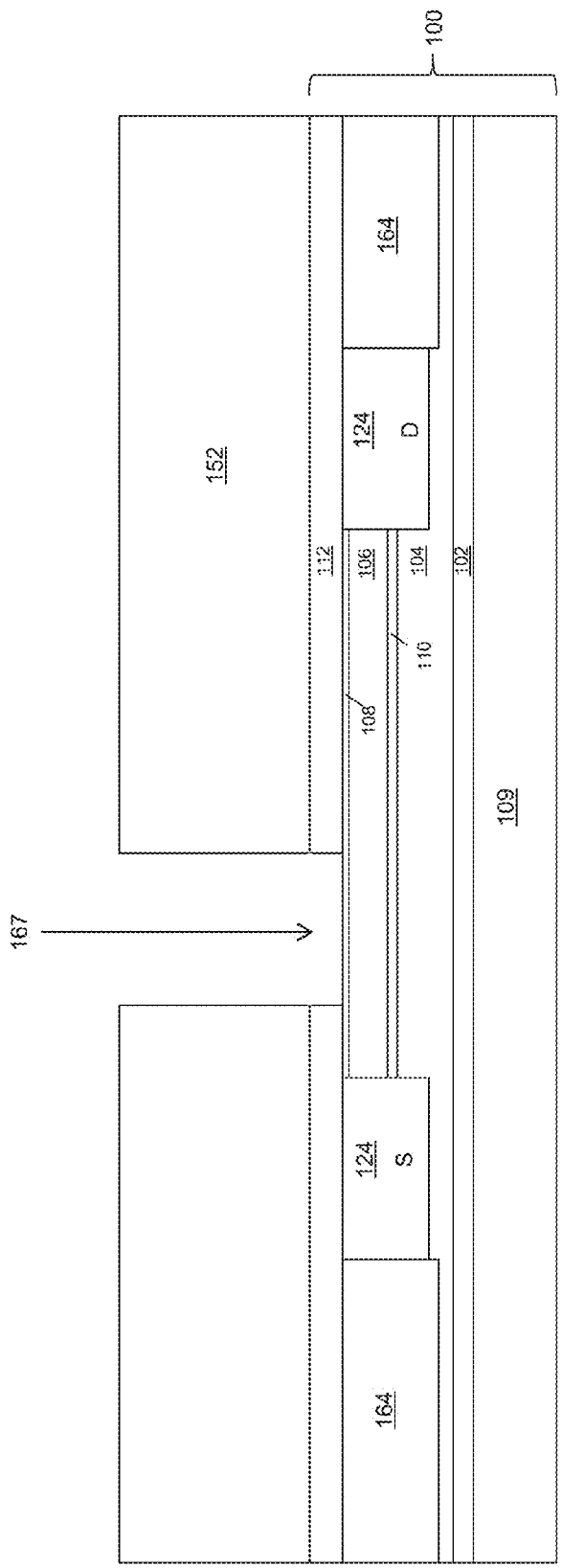
Figure 12D:
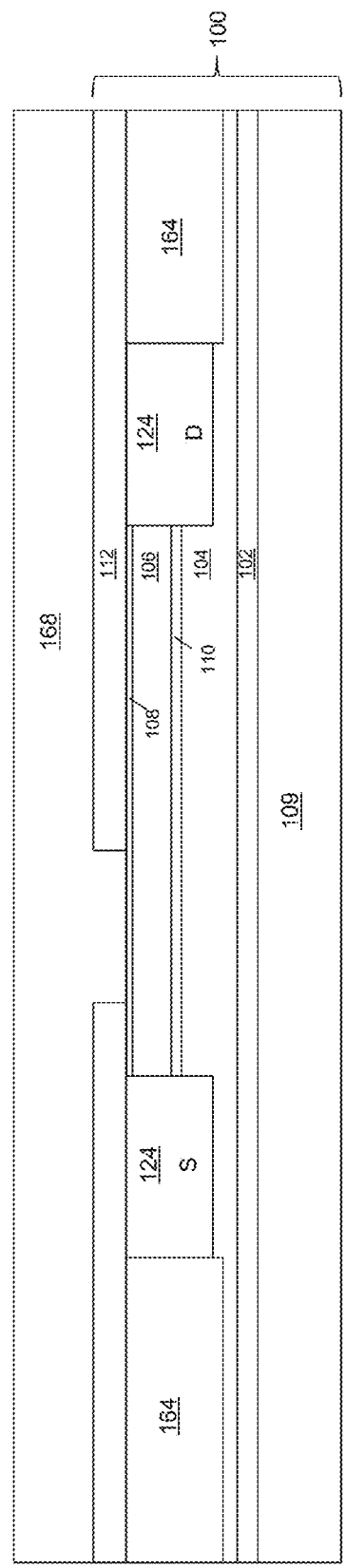
Figure 12E:
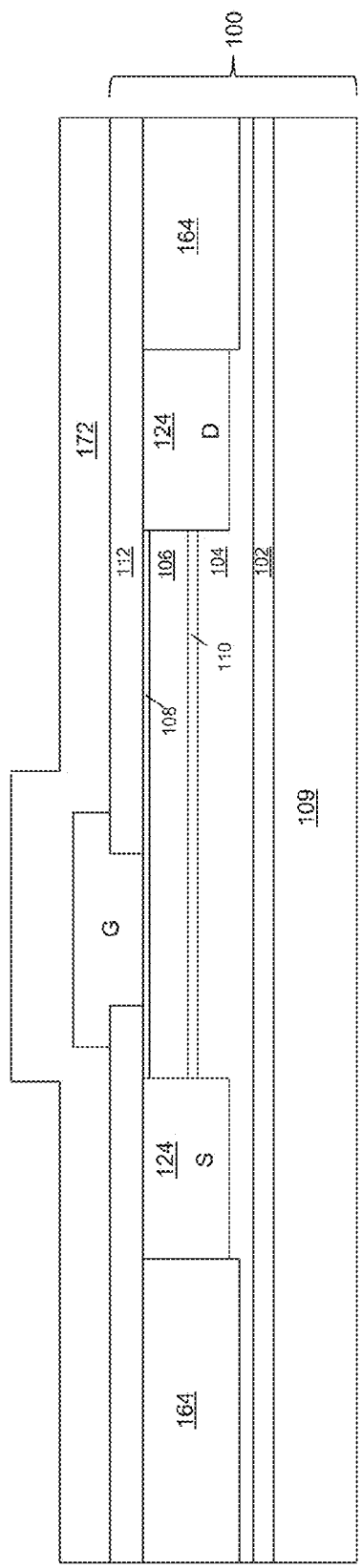

An isolation region 164 can be formed surrounding each device, to isolate adjacent devices from one another. In one embodiment, the isolation region 164 is formed by implanting Ar 166 into the semiconductor body 100 outside the active device region as shown in FIG. 12B. The mask 152 and the underlying passivation layer 112 are then opened e.g. by an etching process in a region where the gate of the device is to be formed as shown in FIG. 12C. The mask 152 is removed and a gate metal 168 formed on the top surface of the device structure e.g. by a deposition process, filling the opening 167 previously formed in the passivation layer 112 as shown in FIG. 12D. The gate metal 168 is patterned to form the gate (G) of the device, and an interlayer dielectric 172 is then deposited on the device structure as shown in FIG. 12E.

Figure 12F:
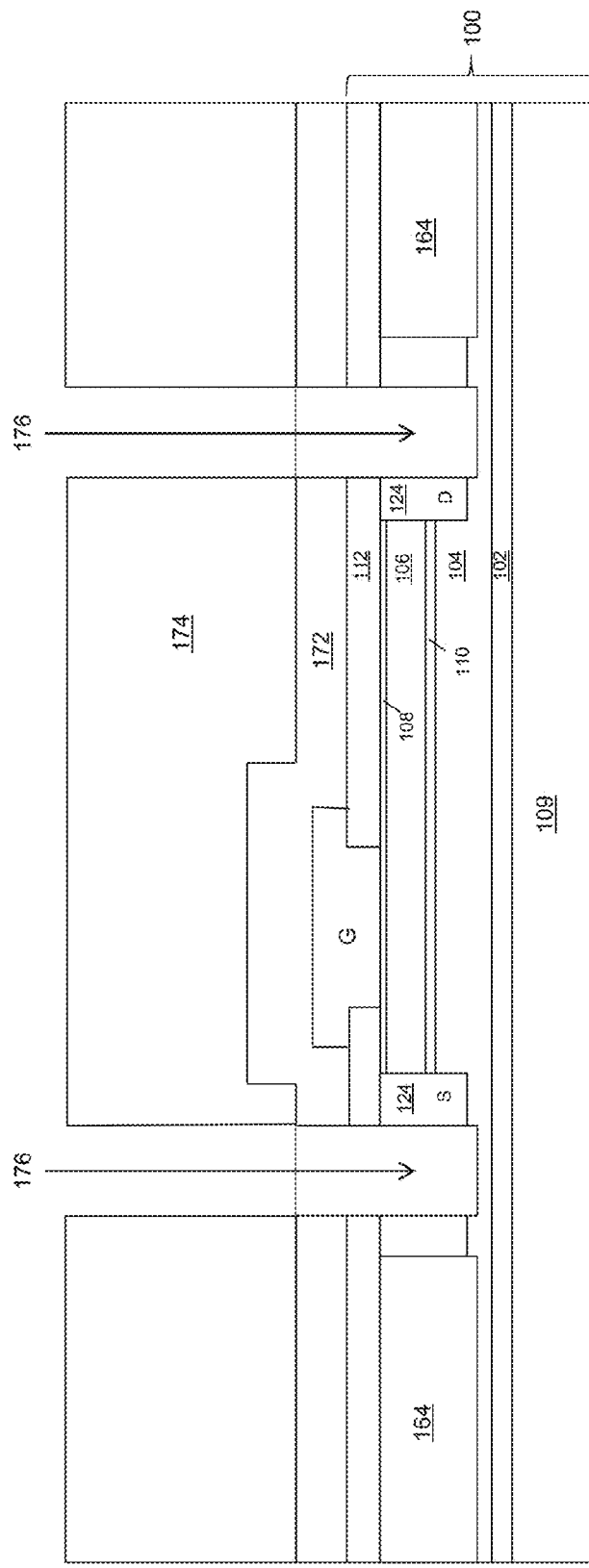
Figure 12G:
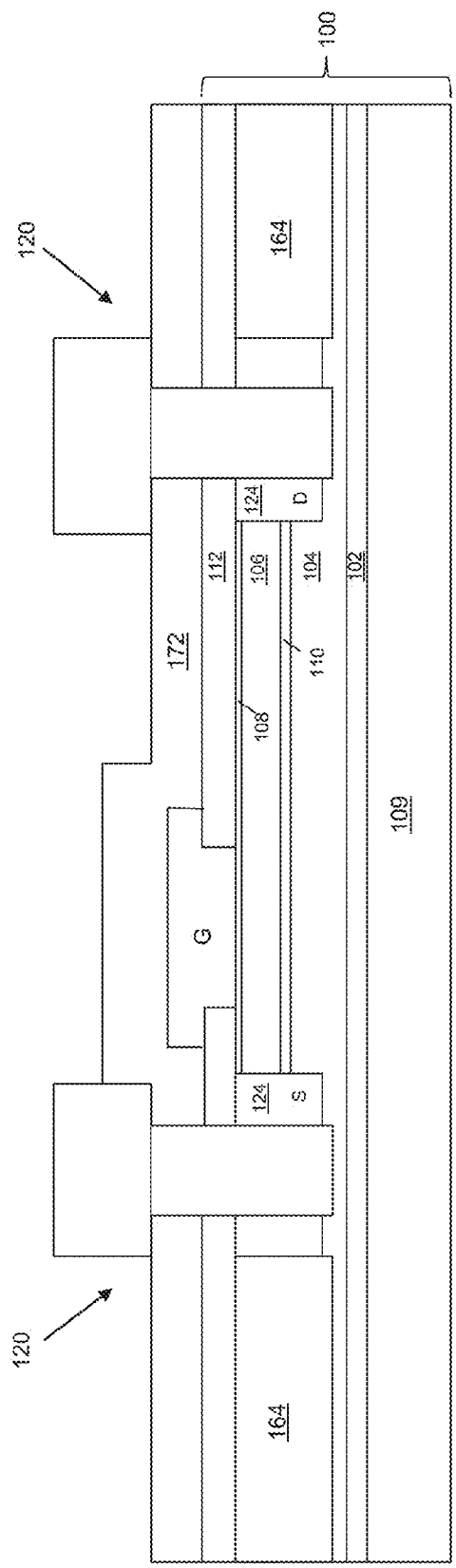

Another mask 174 is then deposited on the interlayer dielectric 168, and openings 176 are formed through the mask 174, the interlayer dielectric 172, the passivation layer 112 and into the implanted (source/drain) regions 124. The openings 176 can extend completely through the implanted regions 124 as shown in FIG. 12F, and even further into or completely through the underlying substrate 109 if desired. Alternatively, the openings 176 end prior to the bottom of the implanted regions 124. In each case, the openings 176 are filled with a metal which is patterned to form the respective metal regions 122 of the source and drain side contact structures 120 as shown in FIG. 12G.

Figure 13:
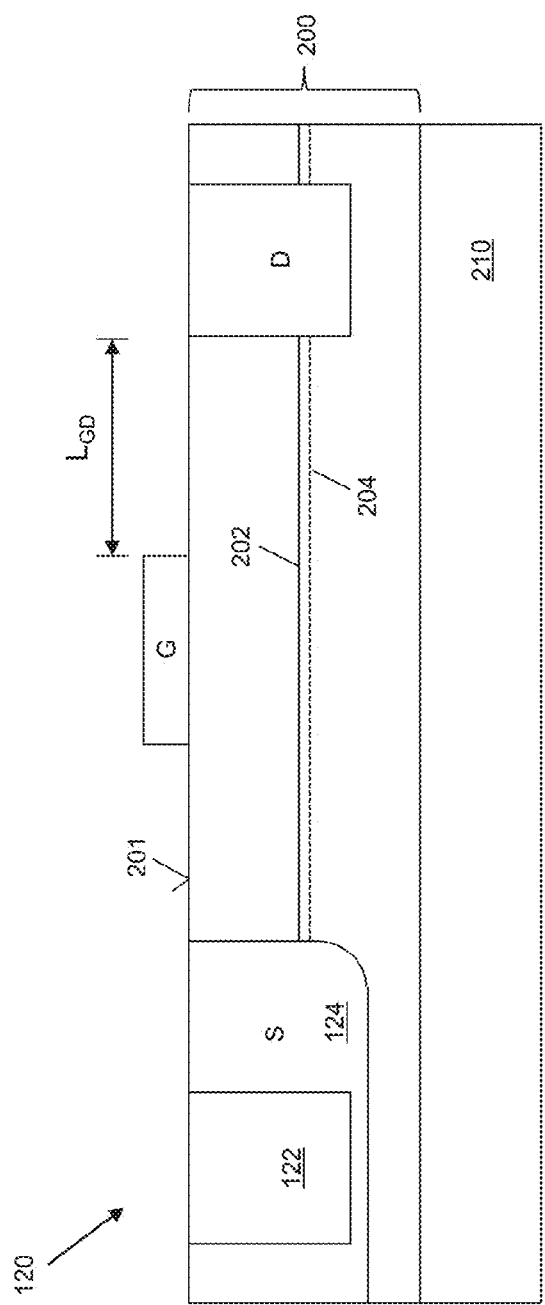
FIG. 13 illustrates a partial cross-sectional view of a compound semiconductor transistor with a contact structure having a metal region and a doped region formed in a body of the device.
Figure 14:
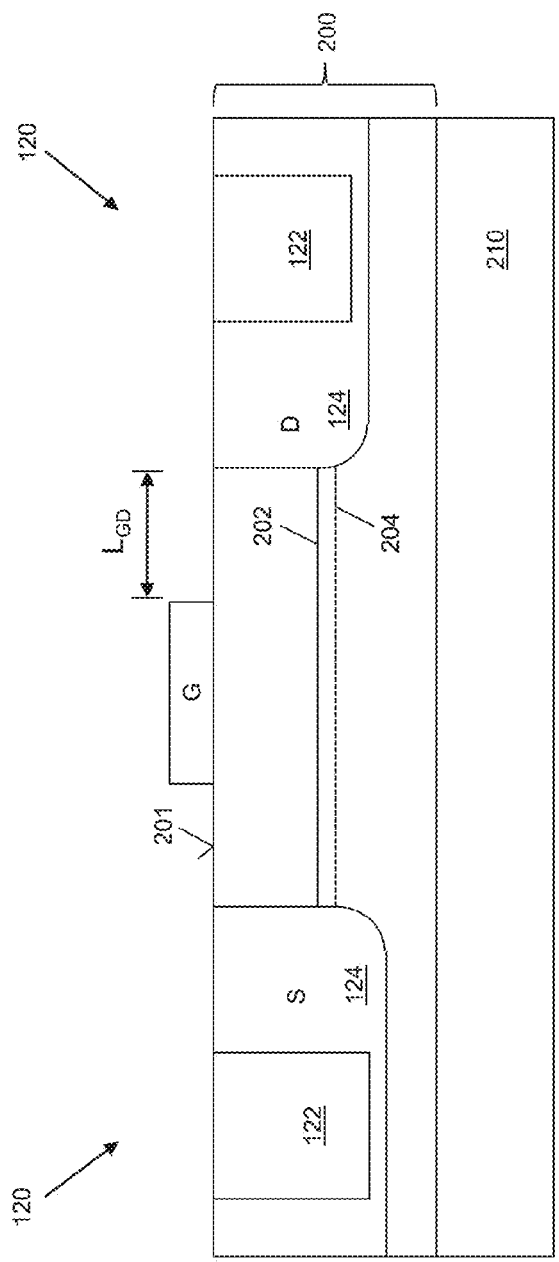
FIG. 14 illustrates a partial cross-sectional view of a compound semiconductor transistor with a contact structure having a metal region and a doped region formed in a body of the device according to another embodiment.

FIGS. 13 and 14 illustrate respective cross-sectional views of different embodiments of a transistor which includes the contact structure 120. The transistor includes a source region S and a drain region D formed in a compound semiconductor body 200. The compound semiconductor body 200 is formed on a substrate 210 and has at least one heterojunction 202 between two dissimilar semiconductor materials and a channel region 204 below the heterojunction 202. The source and drain are spaced apart from one another by the channel region 204. The transistor also includes a gate G operable to control the channel region 204. The gate may have an underlying material such as p-GaN, SiOx, etc. to manipulate the threshold voltage of the device. The doped region 124 of the contact structure 120 forms the source of the transistor according to the embodiment shown in FIG. 13. The contact structure 120 can also be formed on the drain side as shown in FIG. 14, where the doped region 124 of the drain side contact structure 120 forms the drain. In each case, the metal region 122 of the contact structure 120 extends into the compound semiconductor body 200 from the top side 201 to at least the compound semiconductor layer which includes the channel region 204. The metal region 120 can extend shallower in the compound semiconductor body 200 from the top side 201 than the doped region 124 of the contact structure 120 e.g. as shown in FIGS. 1, 3, 4 and 8. Alternatively, the metal region 122 can extend completely through the doped region 124 at the source and/or drain side of the transistor so that the metal region 122 extends deeper in the compound semiconductor body 200 from the top side 201 than the doped region 124 e.g. as shown in FIGS. 5 and 9. The metal contact region 122 at either the source and/or side can extend completely through the semiconductor body 200 into or completely through the underlying substrate 210 e.g. as shown in FIGS. 6 and 7. The contact structure 120 has a reduced transition resistance between the channel region 204 and the doped region 124 of the contact structure 120 and avoids the transition resistance at the heterojunction 202 as previously described herein. This is particularly beneficial for lower voltage applications e.g. 30V or less. As such low operating voltages, the transistor can have a gate-to-drain length $L_{GD}$ of 1 µm or less.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
    a semiconductor body comprising a plurality of compound semiconductor layers and a two-dimensional charge carrier gas channel region formed in one of the compound semiconductor layers; and
    a contact structure disposed in the semiconductor body and comprising:
        a metal region extending into the semiconductor body from a first side of the semiconductor body to at least the compound semiconductor layer which includes the channel region; and
        a doped region formed in the semiconductor body between the metal region and the channel region so that the channel region is spaced apart from and electrically connected to the metal region through the doped region,
    wherein an interface between the doped region and the metal region is perpendicular to the first side,
    wherein the metal region comprises a lateral side and a bottom side, the lateral side extending from the first side to the bottom side, the lateral side being perpendicular to the first side and the bottom side being parallel to the first side, and wherein the channel region is spaced apart from and electrically connected to the lateral side through the doped region.

2. A semiconductor device according to claim 1, wherein the two-dimensional charge carrier gas channel region is a two-dimensional electron gas channel region and the doped region is a region of the semiconductor body doped with Si.

3. A semiconductor device according to claim 2, further comprising nitrogen vacancies disposed in a region of the semiconductor body adjacent lateral and bottom sides of the metal region.

4. A semiconductor device according to claim 1, wherein:
    the semiconductor body comprises a GaN layer and a GaN alloy layer on the GaN layer; and
    the doped region is a region of the semiconductor body doped with Si that extends through the GaN alloy layer into the GaN layer and contacts the two-dimensional electron gas channel region.

5. A semiconductor device according to claim 4, wherein the metal region extends through the GaN alloy layer and into the GaN layer.

6. A semiconductor device according to claim 4, wherein the GaN alloy layer comprises AlGaN or InAlN and the two-dimensional charge carrier gas channel region is a two-dimensional electron gas channel region formed in the GaN layer.

7. A semiconductor device according to claim 1, wherein the metal region extends completely through the semiconductor body.

8. A semiconductor device according to claim 7, wherein the semiconductor body is disposed on a substrate and the metal region extends into the substrate.

9. A semiconductor device according to claim 1, wherein the metal region comprises at least one of Al, AlSi, AlCu, AlSiCu, Ni, Ti, Mo, Pt, Pd, Nb, Re, Ta, Ir, TiAl3, and W.

10. A semiconductor device according to claim 1, wherein the metal region extends deeper into the semiconductor body from the first side than the doped region.

11. A semiconductor device according to claim 1, wherein the doped region does not adjoin the metal region along the first side.

12. A method of manufacturing a semiconductor device, comprising:
   providing a semiconductor body comprising a plurality of compound semiconductor layers and a two-dimensional charge carrier gas channel region formed in one of the compound semiconductor layers; and
   forming a contact structure in the semiconductor body, the contact structure comprising:
      a metal region extending into the semiconductor body from a first side of the semiconductor body to at least the compound semiconductor layer which includes the channel region; and
      a doped region formed in the semiconductor body between the metal region and the channel region so that the channel region is spaced apart from and electrically connected to the metal region through the doped region,
   wherein an interface between the doped region and the metal region is perpendicular to the first side,
   wherein forming the contact structure in the semiconductor body comprises:
      implanting a dopant species into an uncovered part of the semiconductor body;
      annealing the semiconductor body at an elevated temperature to activate the implanted dopant species and form the doped region;
      removing a part of the doped region after implanting and annealing to a depth from the first side of the semiconductor body of at least the channel region to form an opening in the semiconductor body which is laterally spaced apart from the channel region by a remaining part of the doped region; and
      filling the opening with metal.

13. A method according to claim 12, comprising etching the opening completely through the doped region so that the opening extends deeper in the semiconductor body from the first side than the doped region.

14. A method according to claim 13, comprising etching the opening completely through the semiconductor body from the first side to an opposing second side of the semiconductor body.

15. A method according to claim 12, wherein the two-dimensional charge carrier gas channel region is a two-dimensional electron gas channel region and the dopant species is Si.

16. A method according to claim 15, further comprising annealing the semiconductor body at a temperature above 450° C. after the opening is filled with metal to form nitrogen vacancies in a region of the semiconductor body adjacent lateral and bottom sides of the metal region.

17. A method according to claim 12, wherein the semiconductor body comprises a first GaN layer, a GaN alloy layer on the first GaN layer and a second GaN layer on the GaN alloy layer, and wherein implanting the dopant species into the uncovered part of the semiconductor body comprises implanting Si into the second GaN layer, the GaN alloy layer and the first GaN layer so that the doped region contacts the two-dimensional electron gas channel region after annealing.

18. A method according to claim 12, wherein filling the opening with metal comprises at least one of Al, AlSi, AlCu, AlSiCu, Ni, Ti, Mo, Pt, Pd, Nb, Re, Ta, Ir, TiAl3, and W.

* * * * *